United States Patent
Drost et al.

(10) Patent No.: US 6,373,304 B1
(45) Date of Patent: Apr. 16, 2002

(54) TECHNIQUES FOR MAKING AND USING AN IMPROVED LOOP FILTER WHICH MAINTAINS A CONSTANT ZERO FREQUENCY TO BANDWIDTH RATIO

(76) Inventors: Robert J. Drost, Palo Alto; Robert J. Bosnyak, San Jose; Jose M. Cruz, Palo Alto, all of CA (US)

(*) Notice: Subject to any disclaimer, the term of this patent is extended or adjusted under 35 U.S.C. 154(b) by 0 days.

(21) Appl. No.: 08/938,932

(22) Filed: Oct. 2, 1997

(51) Int. Cl.$^7$ .............................. H03K 5/00; H03L 7/06
(52) U.S. Cl. ........................ 327/157; 327/156; 327/553; 327/558
(58) Field of Search ................................ 327/554, 311, 327/552, 558, 336, 108, 337, 344, 553, 157, 149, 156; 333/172

(56) References Cited

U.S. PATENT DOCUMENTS 5,416,438 A * 5/1995 Shibata ..................... 327/553
5,767,714 A * 6/1998 Kotani et al. ................ 327/147

FOREIGN PATENT DOCUMENTS

JP      361087409 A * 5/1986 ................. 327/553

OTHER PUBLICATIONS

Chih–Kong Ken Kang et al., "A 0.8–μm CMOS 2.5 Gb/s Oversampling Receiver and Transmitter for Serial Links", IEEE Journal of Solid–State Circuits, vol. 31, No. 12, Dec. 1996, pp. 2015–2023.

John G. Maneatis, "Low–Jitter Process–Independent DLL and PLL Based on Self–Biased Techniques", IEEE Journal of Solid–State Circuits, vol. 31, No. 11, Nov. 1996, pp. 1723–1732.

Ilya Novof et al., "TA 6.5: Fully–Integrated CMOS Phase–Locked Loop with 15 to 240MHz Locking Range and ±50ps Jitter", 1995 IEEE International Solid–State Circuits Conference, Digest of Technical Papers, ISSCC95/Session 6/Digital Design Elements, Feb. 16, 1995, pp. 112–113.

* cited by examiner

Primary Examiner—Dinh T. Le

(57) ABSTRACT

An improved loop filter contains an active device which maintains a phase lock loop's zero frequency to bandwidth ratio substantially constant with changes in the incoming frequency. It does this by maintaining filter resistance proportional to the inverse square root of the filter current, and without requiring duplicates of circuit elements. Constructed in this way a phase lock loop can be achieved which has a wide operating frequency range and low tracking jitter.

13 Claims, 12 Drawing Sheets

TECHNIQUES FOR MAKING AND USING AN IMPROVED LOOP FILTER WHICH MAINTAINS A CONSTANT ZERO FREQUENCY TO BANDWIDTH RATIO

BACKGROUND OF THE INVENTION

1. Field of the Invention

The invention relates to filters and, more particularly, to loop filters for, inter alia, a phase locked loop which maintains a constant frequency to bandwidth ratio.

2. Description of Related Art

Phase locked clocks are well known in the art for generating a local clock which is phase synchronized with an incoming signal or datastream. Typically, a phase comparator compares the incoming signal with the (optionally divided) output of a voltage controlled oscillator (VCO) and generates an error signal (often using a charge pump) which is filtered and used to control the frequency and phase of the VCO so that it phased the locks with the incoming signal.

3. The Problems

The rising demand for high speed input/output has created an increasingly noisy environment in which phase lock loops (PLL) must function. This noise, typically in the form of supply and substrate noise, tends to cause the output of PLLs to jitter from their ideal timing. With a shrinking tolerance for jitter in the decreasing period of the output clock, the design of low jitter PLLs has become very challenging.

Achieving low jitter in PLL designs can be difficult due to a number of design tradeoffs. Consider a typical PLL which is based on a VCO. The amount of input tracking jitter produced as a result of supply and substrate noise is directly related to how quickly the PLL can correct the output frequency. To reduce the jitter, the loop bandwidth should be set as high as possible. Unfortunately, the loop bandwidth is effected by many process technology factors and is constrained to be well below the lowest operating frequency for stability. These constraints can cause the PLL to have a narrow operating frequency range and poor jitter performance.

One solution for these problems was proposed in an article by John G. Maneatis entitled "Low-Jitter Process-Independent DLL and PLL Based on Self-Biased Techniques" found in Vol. 31, No. 11, of the IEEE Journal of Solid-State Circuits (November, 1996). That article is hereby incorporated by reference in its entirety and is attached as an appendix to this disclosure.

In phase locked loops which are commonly used for clock recovery and generation in digital systems, a charge pump produces an error current, proportional to phase error, which is passed on to a lowpass filter in order to create a control voltage for a voltage controlled oscillator. It is well-known that a lowpass filter constructed out of a series resistor and capacitor has a desirable property of giving phase margins to promote stability in the closed loop response.

Maneatis and others have noted that a desirable way of constructing a phase locked loop such that the loop's zero (which is the series R-C time constant of the loop filter) is a constant fraction of the loop's bandwidth is to construct the resistance such that it is proportional to the inversed square root of the charge pump's biased current. This constant ratio property is desirable since it implies that the phase margin for the closed loop response will be constant.

The prior art has proposed implementations which use a duplicate error current that is fed onto the output stage of the voltage controlled oscillator biasing circuit, utilizing that circuit's output resistance as the loop resistance. The problem with this approach is that the additional charge pump presents additional loading to the phase detectors which are typically right at the outputs of the first input amplifier (since the closed loop delay must be minimized). Thus, the extra loading results in a performance degradation on the bandwidth of the input stage.

Thus a serious problem exists as to how to create a loop filter in which the resistance is such that it is proportional to the inverse square root of the charge pump's biased current without incurring the deleterious loading on high speed nodes.

SUMMARY OF THE INVENTION

The present invention uses a simple feedback loop entirely contained in the lowpass filter itself to implement and control the loop resistance. The lowpass filter has access to the control voltage $V_{ctl}$ that is stored on the loop capacitor. The simple feedback loop consists of an op-amp pulling down on two series connected pmos diodes. The voltage at the drain of the first pmos transistor is compared to $V_{ctl}$ and equalized by the closed loop action of the op-amp feedback. The lower pmos diode then transfers an identical voltage across its drain to source. The drain voltage on the lower pmos is used as the gate voltage for the pmos transistors that are placed in series with loop capacitor to implement the loop resistance. The gate to source/drain voltage of these pmos transistors is thus equal to the control voltage of the loop and has a desired property of being proportional to the inverse square root of the biased current. No additional loading has been put on any circuit nodes outside of the loop filter. The loop filter capacitor node can easily handle the extra loading of the control loops since it is specifically targeted to be a heavy capacitance load.

The foregoing and other features, aspects and advantages of the present invention will become more apparent from the following detailed description of the present invention when taken in conjunction with the accompanying drawings.

BRIEF DESCRIPTION OF THE DRAWINGS

The objects, features and advantages of the system of the present invention will be apparent from the following description in which.

NOTATIONS AND NOMENCLATURE

The detailed descriptions which follow may be presented in terms of program procedures executed on a computer or network of computers. These procedural descriptions and representations are the means used by those skilled in the art to most effectively convey the substance of their work to others skilled in the art.

A procedure is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operation of the present invention include general purpose digital computers or similar devices.

The present invention also relates to apparatus for performing these operations. This apparatus may be specially constructed for the required purpose or it may comprise a general purpose computer as selectively activated or reconfigured by a computer program stored in the computer. The procedures presented herein are not inherently related to a particular computer or other apparatus. Various general purpose machines may be used with programs written in accordance with the teachings herein, or it may prove more convenient to construct more specialized apparatus to perform the required method steps. The required structure for a variety of these machines will appear from the description given.

DESCRIPTION OF THE PREFERRED EMBODIMENT

Figure 1A:
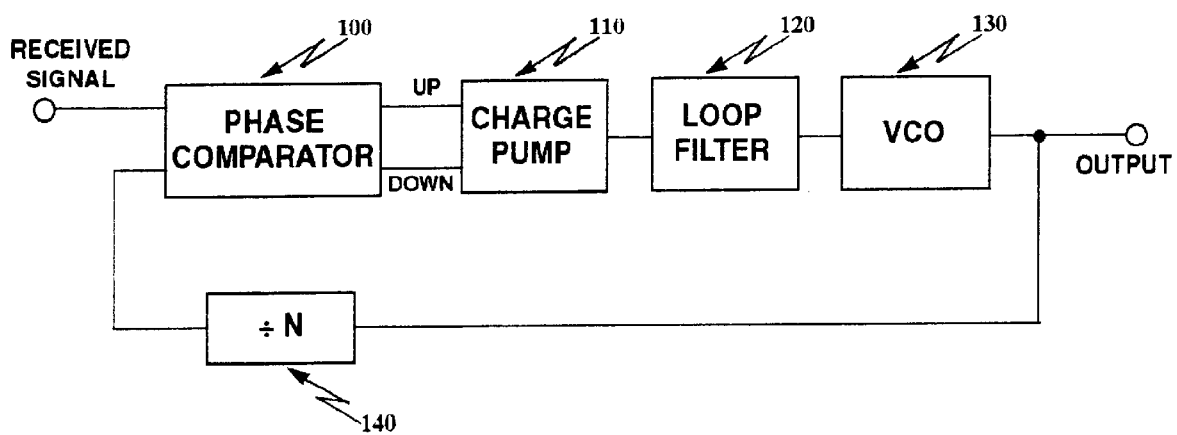
FIG. 1A is a block diagram of a phase locked loop using a loop filter in accordance with one embodiment of the invention.

FIG. 1A is a block diagram of a phase locked loop using a loop filter in accordance with one aspect of the invention. A phase comparator 100 receives the incoming signal and compares it with an optionally divided (140) version of the output of voltage controlled oscillator 130. Depending on the results of the phase comparison, either an up control signal is exerted or a down control signal is exerted. The up and down control signals are used to drive a charge pump 110 to provide charge packets of positive or negative polarity to the loop filter 120, depending on the results of the phase comparison. The loop filter 120 utilized is described in more detail hereinafter. The output of the loop filter is utilized to provide a control signal to the VCO 130 to change its frequency in accordance with the results of the phase comparison in phase comparator 100.

Figure 1B:
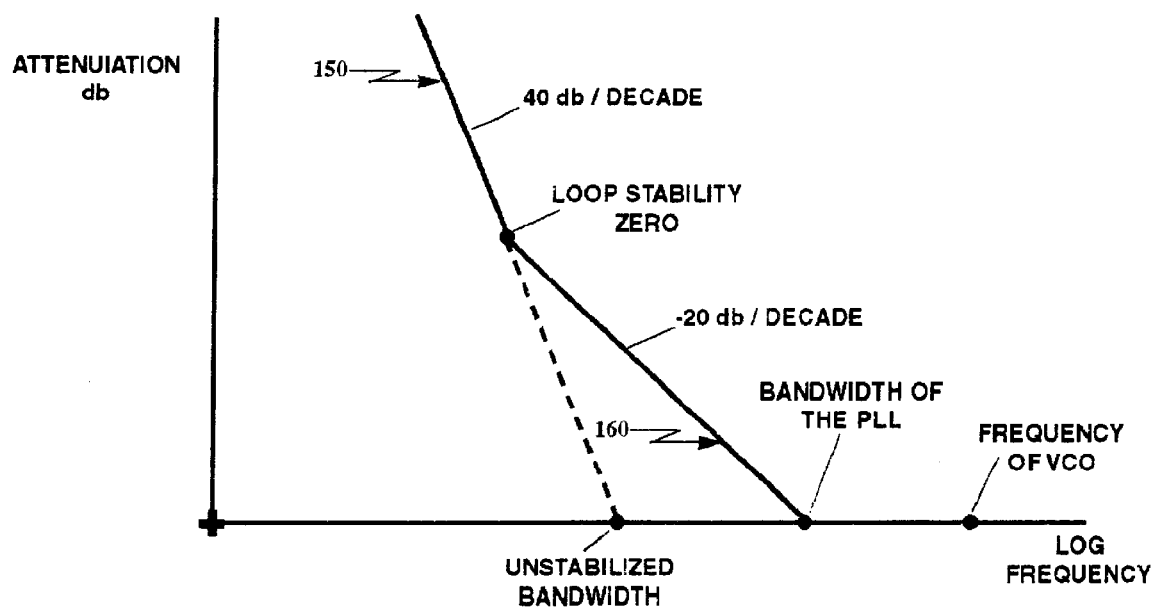
FIG. 1B is a graph showing loop filter response.

FIG. 1B is a graph showing loop filter response. The loop filter response has two relatively linear regions on the logrithmetic scales shown. Region 150 has a slope of approximately −40 db per decade of frequency up to the loop stability zero point. If that line were projected through to the axis as shown by the dashed line, the projection point would represent the unstablized bandwidth of the loop filter. At the loop stability zero point, the slope changes to approximately −20 db per decade. The point where curve 160 intersects the axis is the bandwidth of the phase locked loop. Shown for reference purposes is the frequency of the VCO.

Maneatis has shown that a constant bandwidth loop filter can constrain the achievement of a wide operating frequency range and low input tracking jitter. Maneatis has also shown that it is desirable to set the loop resistance to vary inversely proportionally to the square root of the buffer bias current. When that is achieved, the loop bandwidth to operating frequency ratio becomes a constant times the ratio of two capacitances. Thus, the loop bandwidth will track the operating frequency and therefore sets no constraints on the operating frequency range. As discussed more in detail hereinafter, the loop filter construction disclosed herein uses a simple feedback loop entirely contained in the lowpass filter itself to implement and control the loop resistance.

Figure 2:
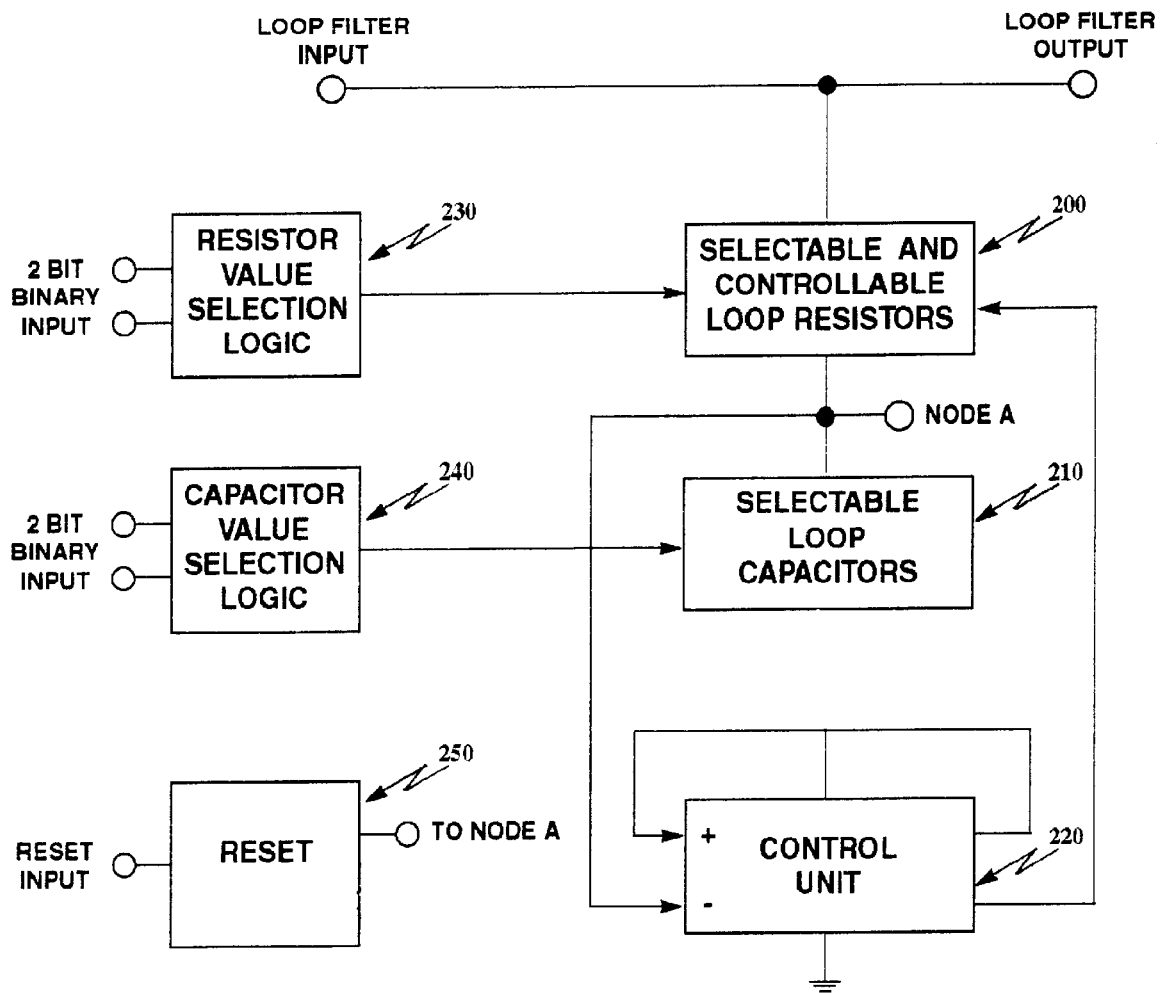
FIG. 2 is a high level block diagram of a loop filter in accordance with one embodiment of the invention.

FIG. 2 is a high level block diagram of a loop filter in accordance with one embodiment of the invention implementing this approach. The loop filter consists of a plurality of selectable and controllable loop resistors 200 in series with a plurality of selectable loop capacitors 210 and a control unit 220. The possible values of the selectable loop resistors and selectable loop capacitors are established by resistor value selection logic 230 and capacitor-value selection logic 240, respectively. A reset circuit 250 permits certain initialization conditions to be established on start up to ensure appropriate operation. Each of the blocks shown in FIG. 2 is discussed more in detail hereinafter. The series resistor and loop capacitor are digitally selectable from one out of four possible values. The series resistor is implemented by a pmos pass transistor, the gate voltage of which is available to be controlled in order to modify the series resistance as needed. The function of the resistor value selection logic 230 and capacitor value selection logic 240 is simple, combinatorial logic to turn on appropriate pass gate switches to select the amount of series resistance and loop capacitance desired.

The loop zero control is more complex. It functions to control the series resistance so that the loop stabilizing zero is a constant proportion away from the VCO's frequency. This needs to be done in order to maintain a constant phase margin in the PLL clock recovery control system. The prior art utilizes a diode resistance when summing proportional current into voltage or current controlled oscillator to implement the equivalent of a controlled series resistance. In the environment of this implementation, using the techniques of the prior art would be awkward since the clock phase detector outputs only one current that is already input to the loop filter. Much of the circuitry for the phase detector would need to be completely duplicated in order to produce another current signal. In addition to the extra chip area, this would incur extra loading which could effect the sense amplifier speed. Using the techniques disclosed herein, the control circuit for the series resistance uses a control loop with higher bandwidth than the PLL to duplicate the $V_{dd}$–$V_{sp}$ voltage difference across the gate to source voltage of the pmos pass transistor which is implementing the series resistor. In this way, the resistance is controlled by the VCO's control voltage. Additionally, to eliminate body effects, the n-well of the pmos transistor is tied to the source node.

Figure 3A:
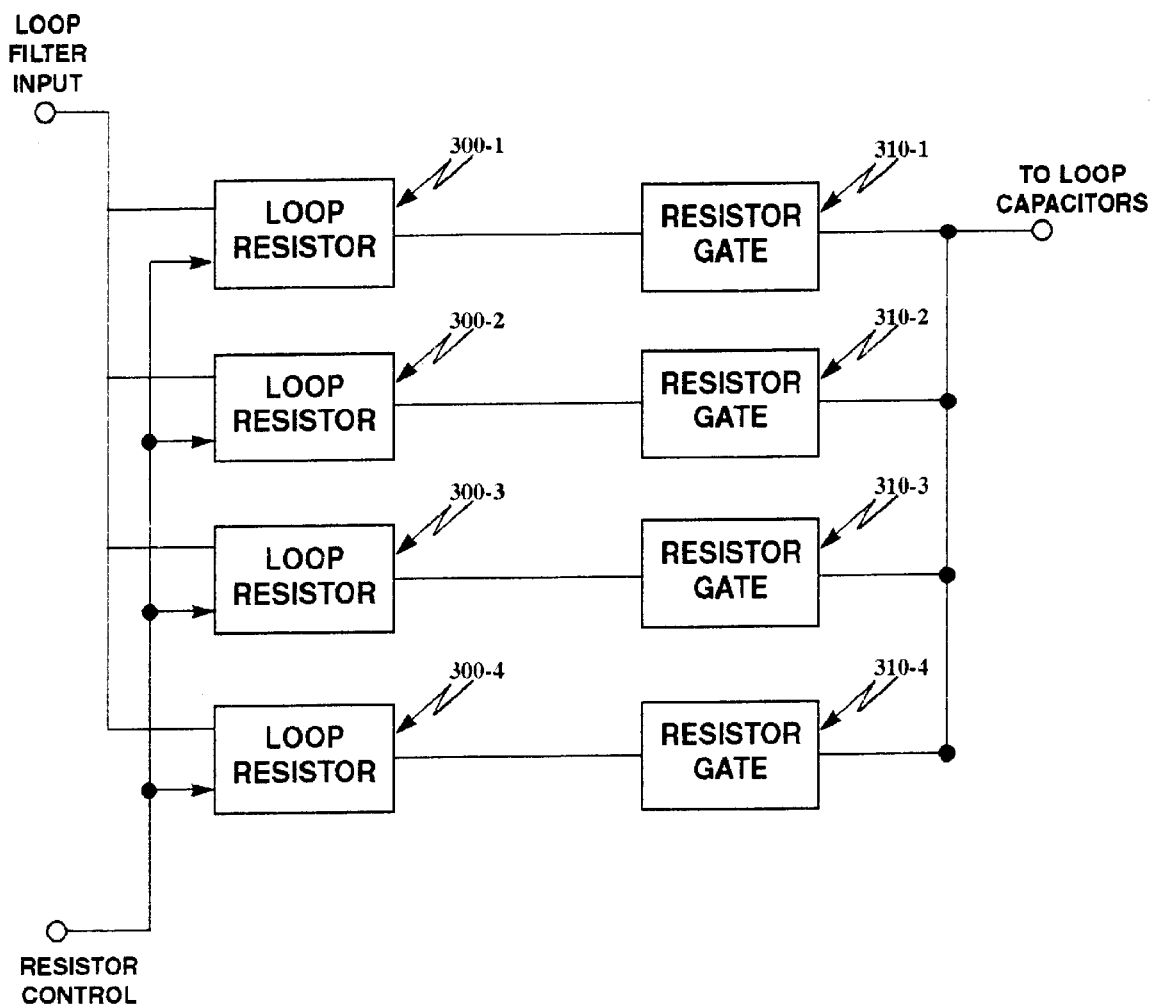
FIG. 3A is a block diagram of selectable loop resistors shown in FIG. 2.

FIG. 3A is a block diagram of selectable loop resistors shown in FIG. 2. A plurality of controllable loop resistors 301–304 is connected to the loop filter input. Which of these resistors are active in the circuit depends on which of resistor gates 310-1 through 310-3 are active. These gates are selected by resistor value selection logic 230, as shown in FIG. 2 and discussed more hereinafter.

Figure 3B:
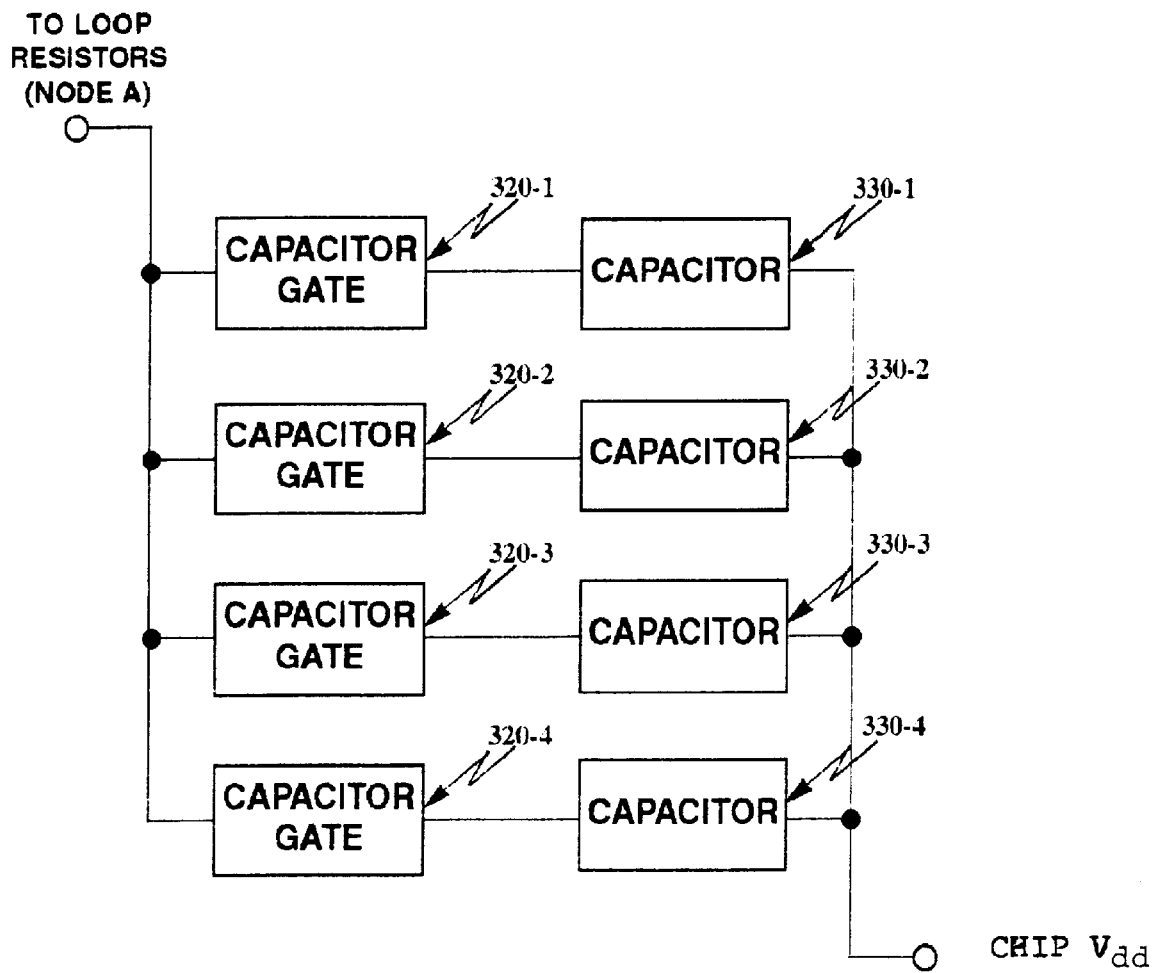
FIG. 3B is a block diagram of selectable loop capacitors shown in FIG. 2.

FIG. 3B is a block diagram of selectable loop capacitors shown in FIG. 2. In a manner substantially analogous to that shown in FIG. 3A, capacitor 330-1 through 330-4 are selectively connected in series with the loop resistors by capacitor gates 320-1 through 3204. The capacitance of the loop filter is determined by which gates are active to connect the capacitors in series with the loop resistors. This is controlled by the capacitor value selection logic 240 shown in FIG. 2. The value of the loop resistors 300-1 through 300-4 can be actively controlled by the control unit 220 as discussed more hereinafter.

Figure 4:
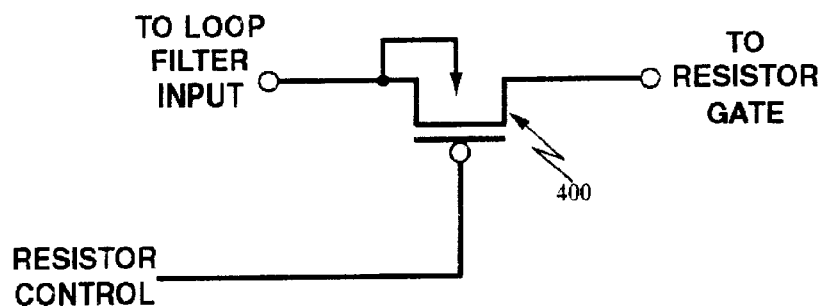
FIG. 4 is a schematic diagram of an exemplary loop resistor shown in FIG. 3.
Figure 5:
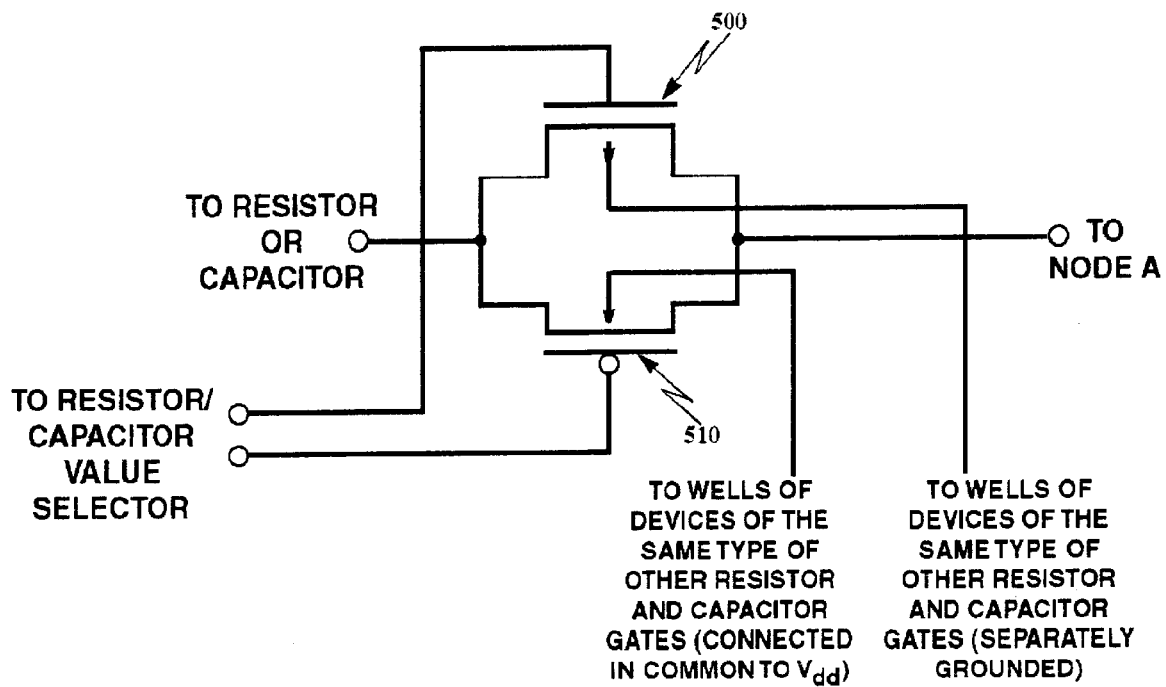
FIG. 5 is a schematic diagram of an exemplary gate used as a resistor gate and as a capacitor gate as shown in FIG. 3.

FIG. 4 is a schematic diagram of an exemplary loop resistor shown in FIG. 3A. The loop resistor is implemented as a standard pmos transistor with a source connected to a loop filter input and a drain connected to a resistor gate such as shown in FIG. 5. The value of resistance can be controlled from a resistor control input connected to the gate of the device.

FIG. 5 is a schematic diagram of an exemplary gate used as a resistor gate and as a capacitor gate as shown in FIG. 3. A pair of pmos and nmos devices, 500 and 510 are controlled on their gates by resistors/capacitor value selector logic to either activate and deactivate the switch thus selectively including the resistor or capacitor connected at the input into the circuit to form an active part of the loop filter. If the gate for a particular resistor or capacitor is inactive, that resistor or capacitor will be effectively switched out of the loop filter. The wells of these devices are connected to the wells of the same type of other gates and connected either to VDD or to ground depending on the device type.

Figure 6:
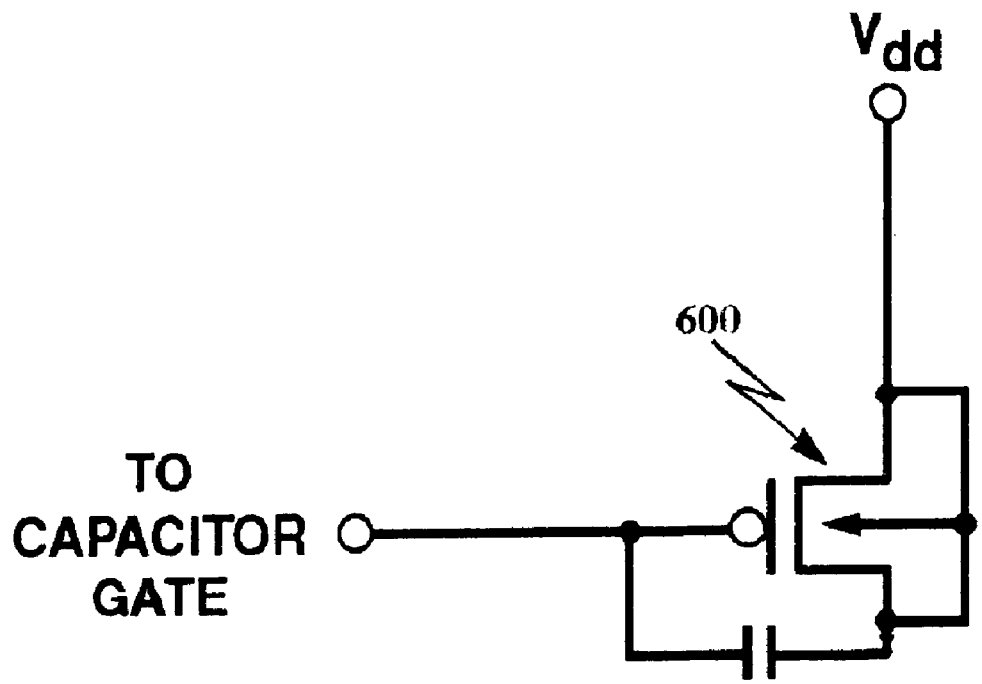
FIG. 6 is a schematic diagram of an exemplary loop capacitor as shown in FIG. 3.

FIG. 6 is a schematic diagram of an exemplary loop capacitor as shown in FIG. 3. The capacitor itself is implemented as a pmos device with a capacitor across the drain and the gate, where the additional capacitance can represent metal and poly interconnect capacitance used to increase and help linearize the parallel total capacitance.

Figure 7:
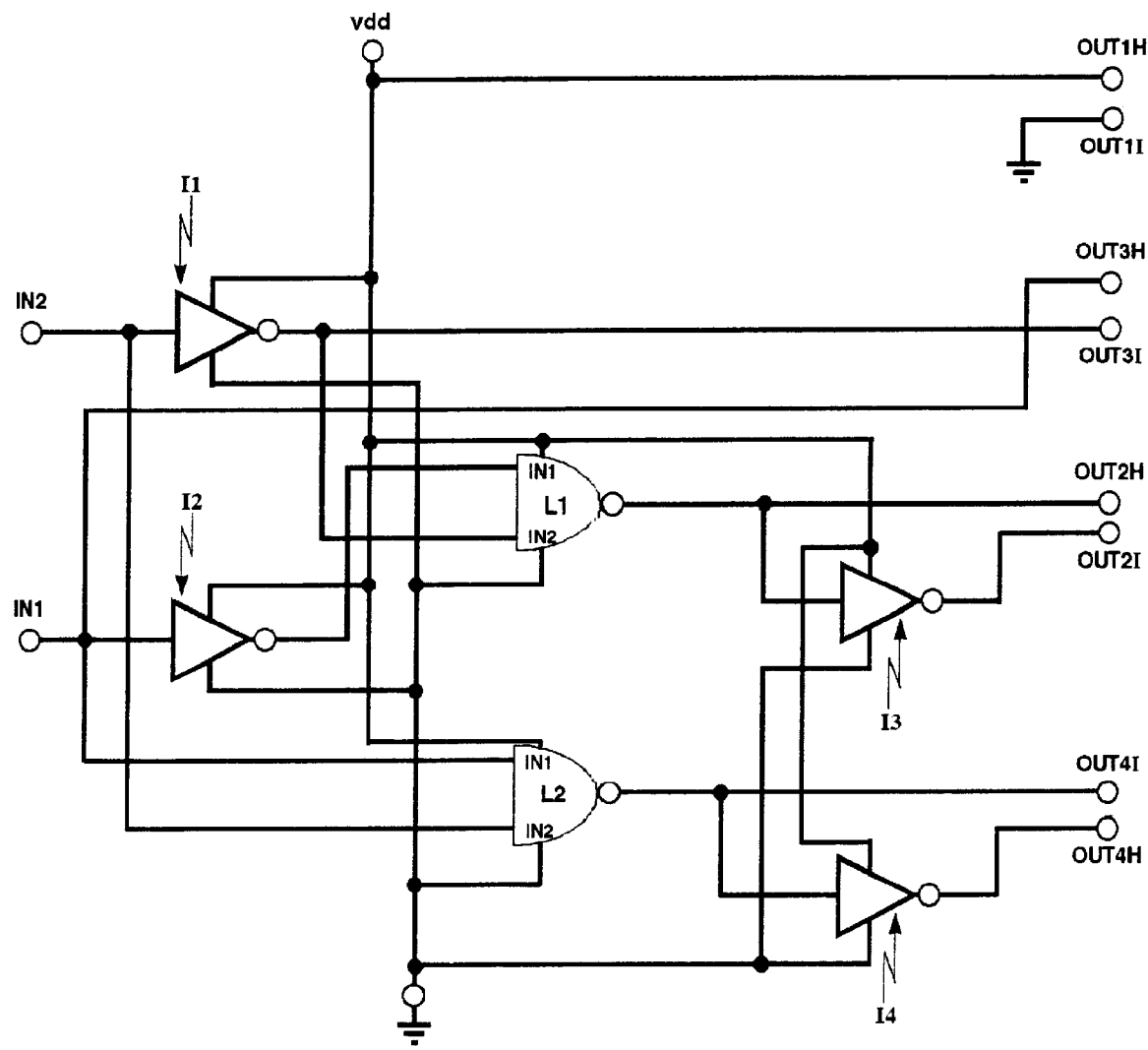
FIG. 7 is a schematic diagram of resistor/capacitor value selector logic shown in FIG. 2.
Figure 8:
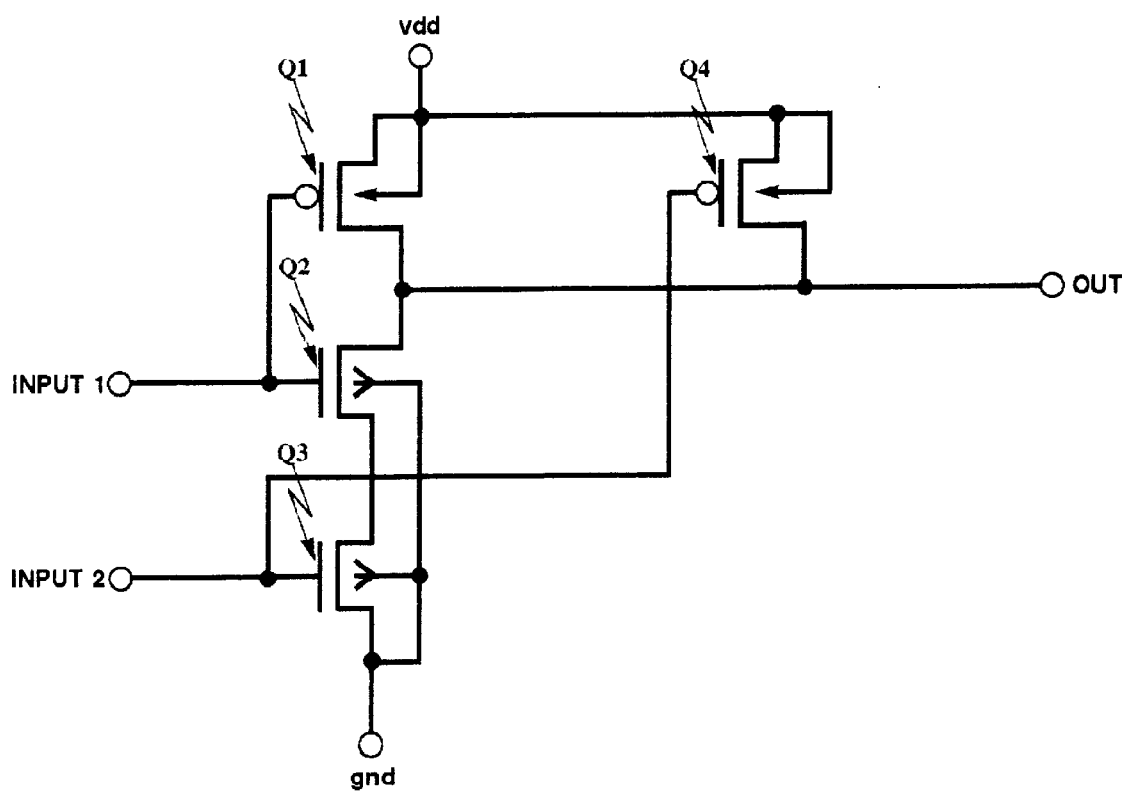
FIG. 8 is a schematic diagram of an exemplary logic units L1 and L2 shown in FIG. 7.

FIG. 7 is a schematic diagram of resistor/capacitor value selector logic shown in FIG. 2. Four pair of gates are controlled by each device. Note that output 1H and 1I a re such that at least one loop filter resistor or capacitor will always be active. The other devices will be switched in or out depending on the state of the two input bits. The construction of gates L1 and L2 are shown in detail in FIG. 8 and require no additional explanation.

Figure 9:
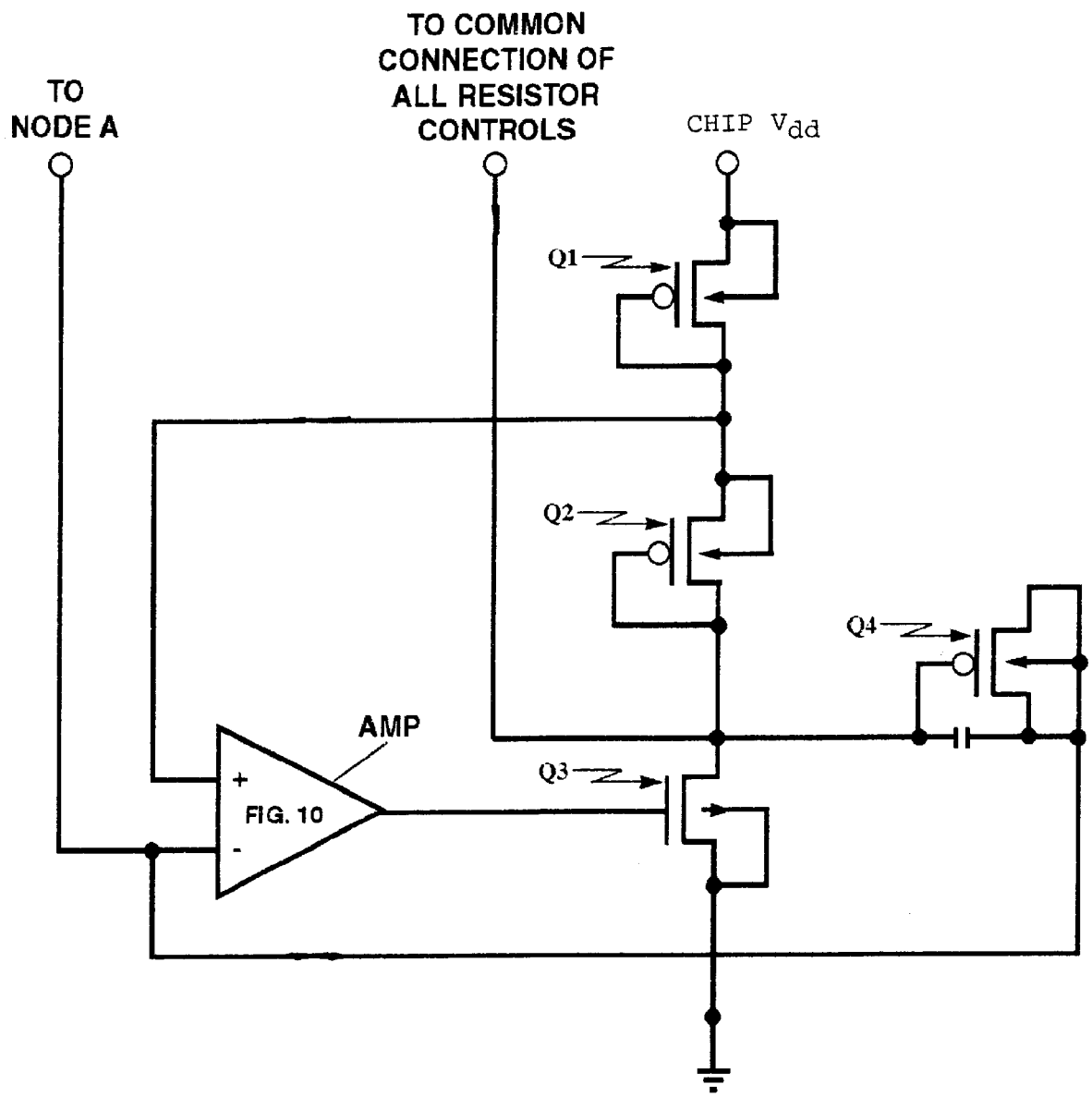
FIG. 9 is a schematic diagram of an exemplary control unit shown in FIG. 2.
Figure 10:
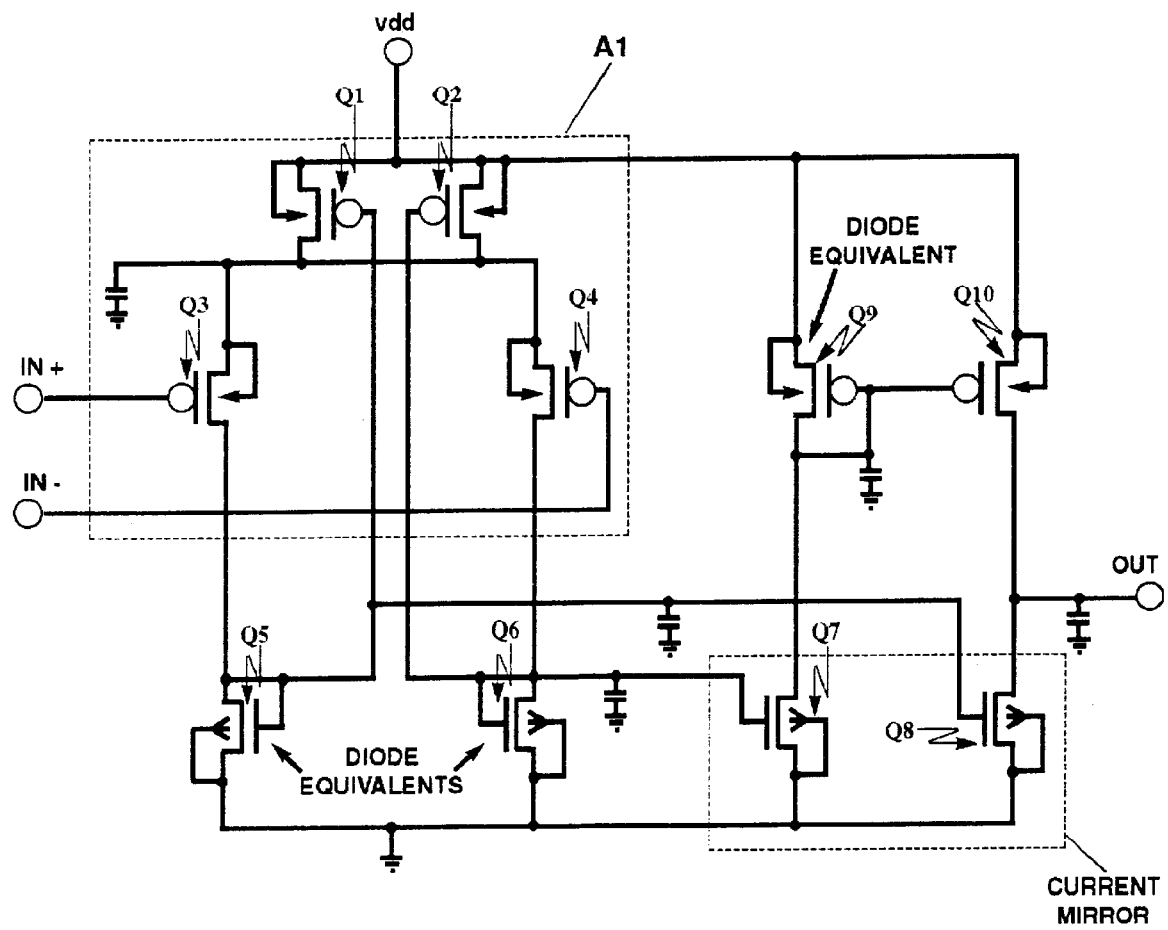
FIG. 10 is a schematic diagram of an exemplary amplifier configuration shown in FIG. 9.

FIG. 9 is a schematic diagram of an exemplary control unit shown in FIG. 2. A series of pmos and nmos devices Q1–Q3 are connected in series between Vdd and ground. Node A is shown in FIG. 2. The amplifier configuration shown in FIG. 10 is utilized to create an output control signal which controls the common connection of all resistor controls to adjust the loop resistance value. It does this utilizing input derived from node A as shown. It functions to maintain the series resistance so that the loops stabilizing zero is a constant proportion away from the VCO's frequency. This is done in order to maintain a constant phase margin in the PLL clock retrieval control system. The control circuit for the series resistance uses a control loop with higher bandwidth than the PLL to duplicate the $V_{dd}-V_{csp}$ voltage difference across the gate to source voltage of the pmos pass transistor which is implementing the series resistor. In this way, the resistance is controlled by the VCO's frequency.

FIG. 10 is a schematic diagram of an exemplary amplifier configuration shown in FIG. 9. FETs Q1 and Q2 form a current source feeding differential amplifier pair of Q3 and Q4. The plus and minus inputs to Q3 and Q4, respectively, are the inputs shown as plus and minus in FIG. 9. FETs Q5 and Q6 are connected as diode equivalents. Devices Q7 and Q8 form a current mirror reflecting the current from the drains of Q3 and Q4. FET Q9 is connected as a diode equivalent and functions with FET Q10 and the output of the current mirror to establish the output of the amplifier configuration as shown in FIG. 9.

Figure 11:
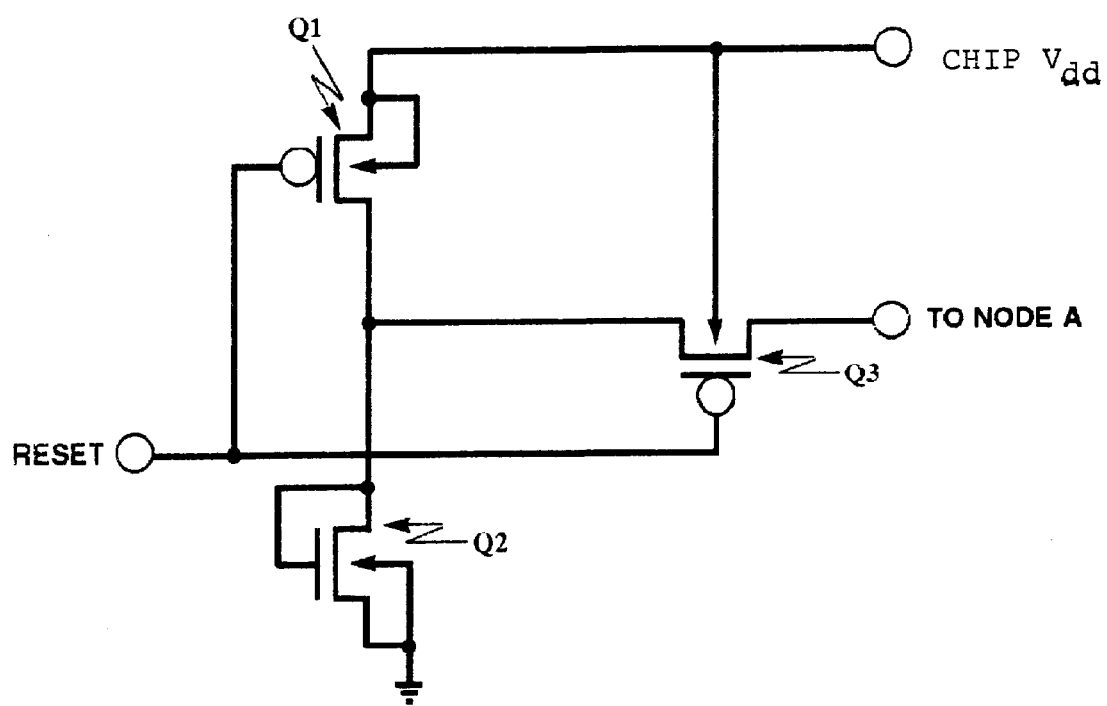
FIG. 11 is a schematic diagram of an exemplary reset circuit shown in FIG. 2.

FIG. 11 is a schematic diagram of an exemplary reset circuit shown in FIG. 2. Under certain conditions, it is desirable to affirmatively assure that correct operating conditions occur on start up or upon reset. The reset circuit shown in FIG. 11 affirmatively does this by establishing initial conditions at node A to ensure correct operation of the device. The reset input is triggered on power up and upon reset in order to establish those conditions.

In theory, Maneatis and others have shown that the desired loop filtered response is:

$$V_c(s) = I_p(s) \times Z(s) = I_p(s) \times \frac{sRC + 1}{sC}$$

where RC is the loop zero. The method used to provide the zero in the prior art was by adding a current to the replica current's output buffer to synthesize the response:

$$V_c(s) = \frac{I_p(s)}{sC} + KR_0 I_p(s)$$

where the first term is a term from the filter capacitor's behavior and the second term is from current fed onto the output resistance of the VCO's biasing circuit. In contrast, the disclosed invention uses pmos transistors connected in series with the loop capacitor as "resistors" and puts a voltage $V_{gs}=V_{ctl}$ across the "resistors." Using the long channel approximation of the pmos transistor's drain to source current for a low $V_{gs}$ and $V_{ds}$:

$$I_{ds} = \mu_p C_{ox} \times \frac{\omega}{L}\left(V_{gs} - V_t - \frac{V_{ds}}{2}\right) \times V_{gs}$$

which is approximately equal to:

$$\mu_p C_{ox} \times \omega/L (V_{gs}-V_t) \times V_{gs}$$

for small $V_{ds}$. The value $R_{ds}$ is equal to the partial derivative of $V_{ds}$ with respect to $I_{ds}$. This leads to the equation:

$$1 = \mu_p C_{ox} \frac{\omega}{L}(V_{gs} - V_t)R_{ds} \text{ or } R_{ds} = \frac{1}{\mu_p C_{ox} \frac{W}{L}(V_{gs} - V_T)}$$

Now $V_{gs}=V_{ctl}$ of the VCO and the VCO's stage currents are given by Maneatis as $$I_{ds} = \frac{\mu_p C_{ox}}{2} \frac{W'}{L'} (V_{ctl} - V_T)^2$$

substituting in for $$V_{gs} - V_T = V_{ctl} - V_T \alpha \sqrt{I_{ds}}$$

This therefore implies that $R_{ds}$ is proportional to:

$$\frac{1}{\sqrt{I_{ds}}}$$

where $I_{ds}$ is the $I_{ds}$ of the VCO buffer stages, which is the condition stated by Maneatis as needed for correct operation to make the loop zero frequency proportional to the VCO frequency.

Some specific equivalents to note are that pmos transistors were used to implement the controllable resistor since their wells can be tied to a non-$V_{dd}$ voltage in an nwell process. In a pwell process, nmos transistors would have been substituted for those pmos transistors. In a twin-well process pmos or nmos transistors could either be used.

The circuit disclosed overcomes the problems of the prior art and provides a loop filter which enhances the operation of a phase locked loop without the need for the duplicate circuitry of the prior art.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. A filter comprising:
   a. a terminal;
   b. at least one resistive element in series with at least one capacitive element connected to said terminal; and
   c. an active element connected to said at least one resistive element for maintaining filter resistance proportional to an inverse of a filter voltage at said terminal minus a threshold voltage.

2. The filter of claim 1, wherein the terminal is connected to a voltage controlled oscillator, in which the filter voltage minus the threshold is proportional to a square root of a current of the voltage controlled oscillator, so that the filter resistance is proportional to the inverse square root of the voltage controlled oscillator's current.

3. The filter of claim 1 in which said at least one resistive element includes a plurality of resistive elements that are selectively activated to affect a filter response.

4. The filter of claim 3 in which at least one resistive element comprises a field effect device.

5. The filter of claim 4 in which said field effect device is a gate.

6. The filter of claim 1 in which said at least one capacitive element includes a plurality of capacitive elements that are selectively activated to affect a filter response.

7. The filter of claim 6 in which at least one capacitive element comprises a field effect device.

8. The filter of claim 4 in which said field effect device is a gate.

9. The filter of claim 1 in which said active element comprises a circuit for controlling a resistance value of said at least one resistive element based on the filter voltage.

10. The filter of claim 1 in which said active device comprises a differential amplifier, a current mirror and a voltage divider cooperating to establish an operating point for the at least one resistive elements.

11. The filter of claim 1 further comprising a reset circuit connected to at least one of the at least one resistive element and the at least one capacitive element for ensuring that initial operating conditions are affirmatively established when power is first established to the filter or upon reset.

12. A phase locked loop having a loop filter and a voltage controlled oscillator (VCO) said loop filter comprising:
   at least one resistor in series with at least one capacitor; and
   an active element connected to said at least one resistor for maintaining a substantially constant ratio of a zero frequency of said phase locked loop to a frequency of said VCO.

13. A method of controlling a stability zero of a filter in a phase locked loop that is a part of a voltage controlled oscillator (VCO), comprising the step of:
   maintaining a resistance of said filter proportional to an inverse square root of a current for said VCO; and
   providing an active element for controlling filter characteristics.

* * * * *